May 7, 1968 F. A. BEHRENS 3,381,533
RAPIDLY STARTING OSCILLATOR
Filed June 16, 1966
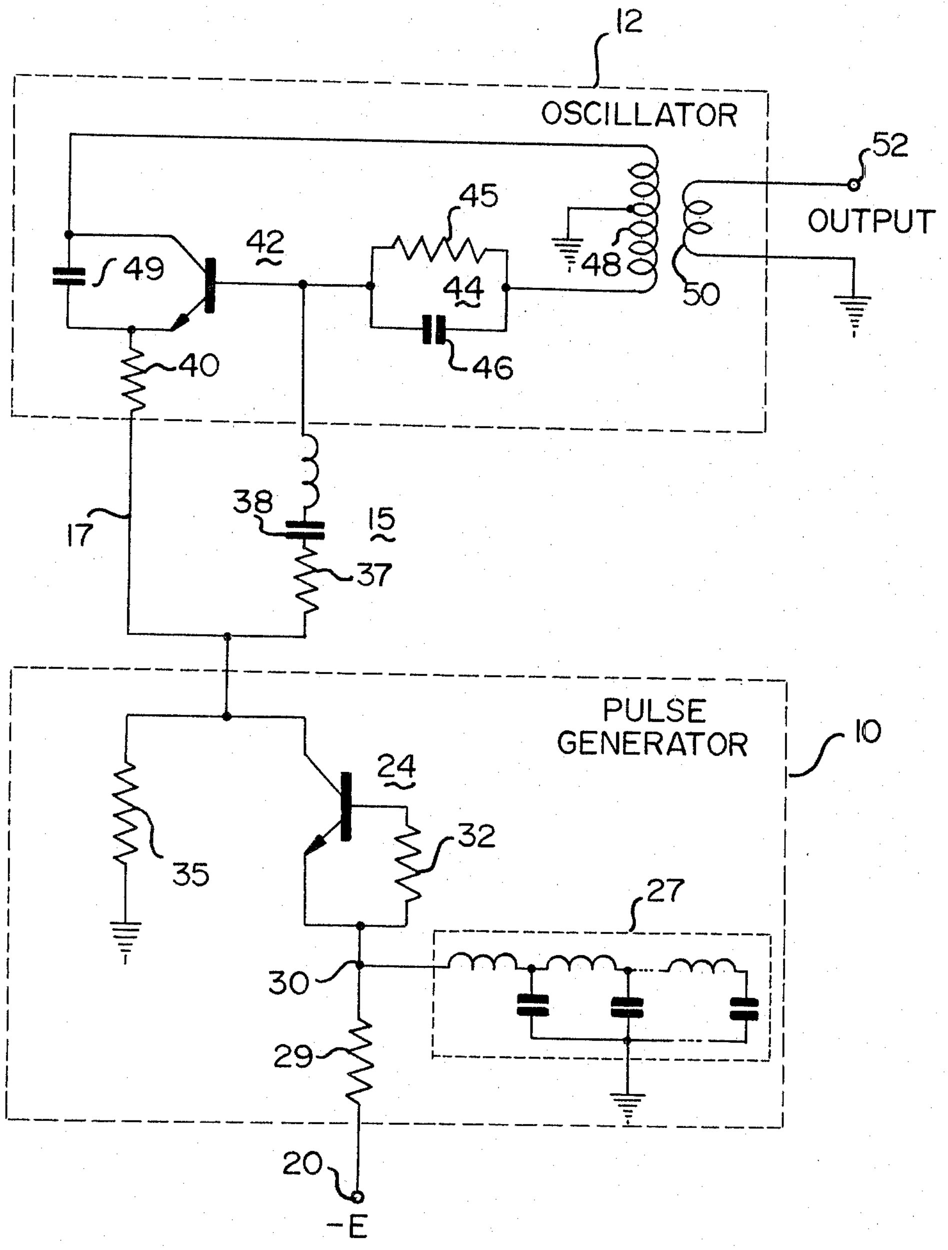
INVENTOR
FREDERICK A. BEHRENS
BY Hurvitz & Rose
ATTORNEYS United States Patent Office 3,381,533
Patented May 7, 1968

3,381,533
RAPIDLY STARTING OSCILLATOR

Frederick A. Behrens, Springfield, Va., assignor to Melpar, Inc., Falls Church, Va., a corporation of Delaware Filed June 16, 1966, Ser. No. 557,978
5 Claims. (Cl. 331—117)

ABSTRACT OF THE DISCLOSURE

A rapid-starting oscillator in which a pulse having a fast rise time is generated by saturating a transistor connected to a pulse forming network, and is applied simultaneously to the transistor of a transistor oscillator, to turn the latter transistor on, and to the frequency determining network of the oscillator, to inject substantially instantaneously a voltage of amplitude corresponding to the steady-state oscillation condition.

The present invention relates generally to oscillators, and more particularly to improvements relating to rapid starting of R-F oscillators with achievement of full amplitude oscillation in a time interval substantially less than one cycle of the R-F oscillations.

Among the many methods employed for starting an oscillator is that in which reliance is placed on the noise level existing when the oscillator is energized. In such a case, the oscillator is turned on by applying the proper voltages to one or more electrodes of its active element or elements, and the R-F oscillations build up from the noise level at a rate determined by the bandwidth and gain of the oscillator circuit. The rate of build up of oscillations can, in some instances, be increased by increasing the bandwidth and gain; however, since bandwidth and gain are usually inversely related, the simultaneous increase of both parameters is generally not feasible so that extremely fast starting times cannot be obtained by using this method. Another disadvantage associated with increasing bandwidth is that such increase lowers the circuit Q and thus reduces the frequency stability of the oscillator.

The rate of build up of oscillations is substantially enhanced over that described immediately above by another prior art method in which a small CW signal of the proper frequency is injected into the oscillator circuit prior to energizing the active element(s) of the oscillator. Such a method permits oscillations to build up from the level of the CW signal rather than from the noise level. The primary disadvantages of the latter method are that a small amount of signal is present before the oscillator is turned on, resulting in the presence of an unwanted output signal in addition to the desired frequency of oscillations; and further, that a separate CW signal source is required.

It is often necessary that an extremely fast starting R-F signal be obtained, for example in high resolution radar systems. The aforementioned methods of starting the oscillator are inadequate for such purposes and have consequently led to the development of a number of rapid starting oscillator circuits. In one of these prior art oscillator circuits, a pulse generator is employed to produce negative pulses which are utilized to trigger a positive spike generator and, as well, are fed to the grid of a vacuum tube having the tuned circuit of an oscillator in its cathode circuit. The positive spike and the negative pulses are mixed or combined prior to application to the grid of the normally conducting tube and this combination is operative to drive the tube into cutoff. When the plate current of the tube ceases the tuned circuit is shock excited into oscillation and the oscillations maintained by a second, normally conductive tube coupled to the tuned circuit in Hartley oscillator configuration. Oscillations continue for the duration of the negative pulse; upon termination of the pulse the first tube resumes conduction whereupon the tuned circuit ceases to oscillate. In this manner, periodic oscillation bursts are generated as an output while the time interval in which the oscillations build up to full amplitude is substantially decreased with respect to the earlier methods of oscillator starting. However, such a circuit requires special synchronization of pulse and spike as well as a mixer or combiner circuit and an active element for shock exciting the tuned circuit of the oscillator.

In another prior art circuit, the active element of the oscillator is turned on by a gating signal applied to the power excitation terminals of the oscillator. The gating signal is also applied to a gating circuit where the leading edge of the fast rise-time pulse constituting the gating signal is differentiated, and the resulting spike or impulse amplified, inverted, and amplitude limited. The resulting signal is employed to shock excite the tuned circuit of the oscillator into a negative half cycle of oscillation to eliminate starting transients prior to generation of an output pulse from the oscillator circuit. One of the principal problems associated with this method of rapidly starting the oscillator is the lack of synchronization between the pulses applied to energize the active element of the oscillator and the pulse derived by the gating circuit to shock excite the tuned circuit of the oscillator.

It is accordingly a primary object of the present invention to provide an improved method of rapidly starting an oscillator.

It is another object of the present invention to provide an oscillator circuit wherein full amplitude oscillations are achieved within a small fraction of one cycle of the R-F output frequency.

Still another object of the present invention is to provide an extremely simple and reliable oscillator circuit wherein the turning on of the active element of the oscillator is fully synchronized with the injection of a fast rise-time pulse into the frequency determining elements of the oscillator such that the initial voltage and current levels existing in the oscillator circuit are substantially those which would have existed had the oscillator been operating in the steady state for a long period of time prior to actual starting.

Oscillators in accordance with the present invention include the advantages that the fast rise-time pulse is simultaneously employed to energize the oscillator and to establish full amplitude of operating voltages and currents, so that full amplitude oscillations are achieved within one quarter of an R-F cycle or less, and the usual requirement of a separate signal source is eliminated; generation of the fast-rise time pulse from a reference signal so that the oscillator signal may be made phase coherent with the reference signal and also from pulse to pulse; and the utilization of high Q frequency determining elements so that frequency stability and high gain may be obtained simultaneously.

According to the present invention, the aforementioned objects and advantages are realized by the provision of an extremely simple, yet reliable circuit arrangement including a fast rise-time pulse generator, and an oscillator having an active element responsive to the pulse output of the pulse generator, and a feedback circuit for the oscillator having frequency-determining elements responsive to the pulse generator output applied via a simple coupling circuit. The active element of the oscillator is energized (i.e., the oscillator is turned on) simultaneously with the injection of a fast rise-time pulse into the frequency-determining elements of the oscillator circuit, thereby establishing and maintaining the voltage and current levels normally associated with steady state oscillation existing prior to actual starting. That is, the effect insofar as initial voltage and current levels are concerned is as though the oscillator had been oscillating for a substantial period of time prior to actual starting. The result is the establishment of oscillations at full amplitude within a fraction of the time required by the prior art methods of rapid starting.

The above and still further objects, features and attendant advantages of the present invention will become apparent from a consideration of the following detailed description of a preferred embodiment thereof, especially when taken in conjunction with the accompanying drawing in which:

The sole figure costitutes a circuit diagram of a practical embodiment of the invention.

Referring now to the drawing, the overall oscillator circuit comprises a pulse generator 10, an R-F oscillator 12, and a coupling circuit 15. Generator 10 is operative to supply a pulse having a fast rise-time to oscillator 12 via conductive path 17 when a negative voltage E (reference signal) is applied to terminal 20 of the pulse generator. The generator output pulse is simultaneously applied to one end of winding 48 of the oscillator via coupling circuit 15. The inductive element shown coupled to capacitor 38 of coupling network 15 is simply the lead inductance at the frequencies of interest.

Pulse generator 10 includes an active element in the form of NPN transistor 24; a pulse forming network 27, which may simply comprise a series inductance-shunt capacitance ladder network; an input resistor 29, connecting input voltage terminal 20 to a junction 30 between the pulse forming network, the emitter electrode of transistor 24 and, via biasing resistor 32, a base electrode of the transistor; and a load resistor 35 for the transistor, connected to the collector electrode thereof, from which the output of the generator is taken.

Transistor 24, which is normally nonconductive, is operated in the so-called "avalanche" mode, alternately termed "breakdown" mode or Zener effect and analogous to the breakdown occurring in a gas discharge, to rapidly switch from a high resistance state (full cutoff) to a low resistance state (full saturation) when the voltage appearing at junction 30 (i.e., at the transistor input) reaches a predetermined level.

Oscillator 12 comprises an active element in the form of NPN transistor 42; a bias network 44 comprising the parallel circuit combination of resistor 45 and capacitor 46 serially connected between the base electrode of the transistor and winding 48 (one of the frequency-determining elements), the other end of winding 48 being connected to the collector electrode of the transistor and, via a capacitor 49, to the emitter electrode of the transistor. Serially connected in the conducting path 17 between the output terminal of pulse generator 10 and the emitter electrode of transistor 42 is a resistance 40. The output of the oscillator is taken from terminal 52 at one end of winding 50 which is inductively coupled to winding 48, the other end of winding 50 being grounded. Inductance 48 and the series combination of capacitance 46 and the base to collector capacitance of transistor 42 represent the principal frequency-determining elements of oscillator 12, although feedback capacitor 49 as well as lead capacitance and inductance and other junction capacitance also play a role in determining the resonant frequency of the oscillator.

In the operation of the circuit, the application of a reference signal (negative voltage E) to input terminal 20 of the pulse generator results in the charging of pulse forming network 27 to the voltage level of E through resistor 29. When the voltage level of junction 30, which is pulled toward —E volts, exceeds the predetermined avalanche voltage of transistor 24, the transistor is rapidly driven into full saturation, thereby producing a fast rise-time pulse across the collector load resistor 35. This output pulse is applied to the emitter electrode of transistor 42, via path 17 and resistor 40, to turn on oscillator 12. At the same time, the leading edge of the generator output pulse is coupled to winding 48 via A-C coupling network 15 and biasing network 44 to produce a relatively high amplitude voltage across inductor 48. Resistor 45 and capacitor 46 may be made adjustable to vary the amplitude of the voltage across the winding if desired.

The voltage and current levels thus established in the frequency-determining elements of the feedback circuit of oscillator 12 constitute almost precisely the condition which would have existed had oscillator 12 been oscillating long prior to the instant of its actual energization. Hence, full steady state oscillation is achieved almost instantaneously with the turning on of the oscillator.

In a circuit constructed as shown in the figure the following component values and types were employed:

| Component: | Value or type |
|---|---|
| Resistor 29 | 10K |
| Resistor 32 ohms | 220 |
| Resistor 35 do | 22 |
| Resistor 37 do | 50 |
| Resistor 40 do | 330 |
| Resistor 45 | 56K |
| Transistor 24 | NS1119 |
| Transistor 42 | 2N2857 |
| Capacitor 38 μμf | 10 |
| Capacitor 46 μμf | 10 |
| Capacitor 49 μμf | 1 |

In this circuit, the oscillator output taken at terminal 52 reached full amplitude within one-quarter of an R-F cycle, at a frequency of approximately 500 megacycles per second. The above-indicated component values are presented for the sake of illustration only, and not to be taken as placing any limitations on the invention, except as may be specified in the appended claims.

While I have disclosed a preferred embodiment of my invention it will be apparent that various changes and modifications in the particular details of construction which have been illustrated and described may be resorted ot without departing from the spirit and scope of the invention, as defined in the appended claims.

I claim:

1. A rapid starting oscillator circuit, comprising a pulse generator, having input terminals and output terminals, for generating a fast rise-time pulse at said output terminals upon application of a reference voltage to said input terminals; an oscillator, including an active element and a frequency determining network for said active element; and means for simultaneously applying said fast rise-time pulse to said active element and to said network for establishing substantially full amplitude operating voltage and current levels in said oscillator at the instant of energization of said active element.

2. The combination according to claim 1 wherein said pulse generator comprises a transistor, a pulse forming network coupled to said transistor, a source of fixed D-C energizing voltage for said transistor, said energizing voltage constituting said reference voltage, and a load resistance for said transistor.

3. The combination according to claim 2 wherein said transistor is preset to operate in the avalanche mode for rapid switching between states of low and high resistance upon respective application and removal of said reference voltage.

4. The combination according to claim 3 wherein said means for simultaneously applying includes a parallel path circuit connected to said load resistance, one of said paths connected to an electrode of said active element, and the other of said paths connected to said frequency determining network.

5. A rapid starting oscillator circuit comprising:

(a) a pulse generator, including (1) a normally non-conductive transistor adapted to switch from a cutoff state to a saturation state upon application of a voltage of predetermined amplitude to the input terminals thereof, (2) a pulse forming network including a charging circuit for supplying energizing input voltage to said transistor, (3) means for applying a reference signal to said network to charge said charging circuit to a voltage level exceeding said predetermined amplitude to switch said transistor to the saturation state, whereby said transistor produces a fast rise-time pulse at the output terminals thereof;

(b) an R-F oscillator including (1) a normally non-conductive transistor, (2) a feedback circuit for said transistor including elements for determining the frequency of oscillation of said oscillator, (3) means connected to the output terminals of the first-named transistor for applying the pulse generated therefrom to the transistor of said oscillator for energization thereof to a conductive state; and (c) coupling circuit means further connected to the output terminals of said first-named transistor for injecting said fast rise-time pulse into said frequency determining elements substantially simultaneously with the energization of said oscillator transistor to the conductive state, whereby to establish full amplitude oscillation of said oscillator within a fraction of an R-F cycle thereof.

References Cited

UNITED STATES PATENTS 3,088,079 4/1963 Quigley ------------ 331—117

OTHER REFERENCES

R. C. V. Macario, Electronic Engineering, "Avalanche Transistors," pp. 262–267, May 1959, 307–88.5–2.12.

JOHN KOMINSKI, *Primary Examiner.*

ROY LAKE, *Examiner.*